(12) United States Patent
Samoilov et al.

(10) Patent No.: US 9,343,430 B2
(45) Date of Patent: May 17, 2016

(54) STACKED WAFER-LEVEL PACKAGE DEVICE

(75) Inventors: Arkadii V. Samoilov, Saratoga, CA (US); Tie Wang, Cupertino, CA (US); Yi-Sheng Anthony Sun, San Jose, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 157 days.

(21) Appl. No.: 13/225,296

(22) Filed: Sep. 2, 2011

(65) Prior Publication Data

US 2013/0056866 A1    Mar. 7, 2013

(51) Int. Cl.

| H01L 23/48 | (2006.01) |
|---|---|
| H01L 25/065 | (2006.01) |
| H01L 23/00 | (2006.01) |
| H01L 23/31 | (2006.01) |
| H01L 21/56 | (2006.01) |
| H01L 23/498 | (2006.01) |
| H01L 25/00 | (2006.01) |
| H01L 21/48 | (2006.01) |
| H01L 21/50 | (2006.01) |

(52) U.S. Cl.
CPC .......... *H01L 25/0657* (2013.01); *H01L 21/561* (2013.01); *H01L 21/565* (2013.01); *H01L 21/568* (2013.01); *H01L 23/3128* (2013.01); *H01L 23/49816* (2013.01); *H01L 24/94* (2013.01); *H01L 25/0652* (2013.01); *H01L 25/50* (2013.01); *H01L 21/48* (2013.01); *H01L 21/50* (2013.01); *H01L 2224/16225* (2013.01); *H01L 2225/06513* (2013.01); *H01L 2225/06541* (2013.01)

(58) Field of Classification Search
CPC .... H01L 23/31; H01L 23/4926; H01L 23/488
USPC .......................................... 257/787, 686, 777
See application file for complete search history.

(56) References Cited

U.S. PATENT DOCUMENTS

| 2002/0105092 A1* | 8/2002 | Coyle ........................... 257/778 |
|---|---|---|
| 2004/0150118 A1* | 8/2004 | Honda .......................... 257/778 |
| 2008/0001305 A1* | 1/2008 | Uchida ......................... 257/777 |
| 2008/0211081 A1* | 9/2008 | Lee ............................... 257/691 |
| 2008/0286562 A1* | 11/2008 | Toyoda et al. ............... 428/327 |
| 2009/0146281 A1 | 6/2009 | Jung |
| 2009/0200662 A1 | 8/2009 | Ng et al. |
| 2010/0159643 A1 | 6/2010 | Takahaski et al. |
| 2011/0108977 A1* | 5/2011 | Lin et al. ...................... 257/698 |
| 2011/0183464 A1* | 7/2011 | Takahashi et al. ........... 438/108 |
| 2012/0286407 A1* | 11/2012 | Choi .................. H01L 21/4853 257/670 |

* cited by examiner

*Primary Examiner* — William Harriston
(74) *Attorney, Agent, or Firm* — Advent, LLP

(57) ABSTRACT

Wafer-level package devices are described that include multiple die packaged into a single wafer-level package device. In an implementation, a wafer-level package device includes a semiconductor device having at least one electrical interconnection formed therein. At least one semiconductor package device is positioned over the first surface of the semiconductor device. The semiconductor package device includes one or more micro-solder bumps. The wafer-level package device further includes an encapsulation structure disposed over and supported by the semiconductor device for encapsulating the semiconductor package device(s). When the semiconductor package device is positioned over the semiconductor device, each micro-solder bump is connected to a respective electrical interconnection that is formed in the semiconductor device.

19 Claims, 9 Drawing Sheets

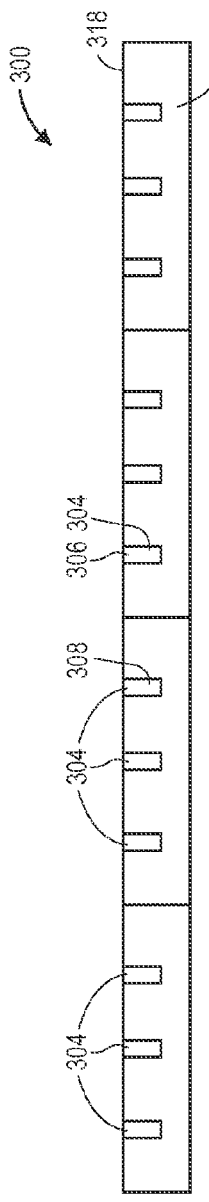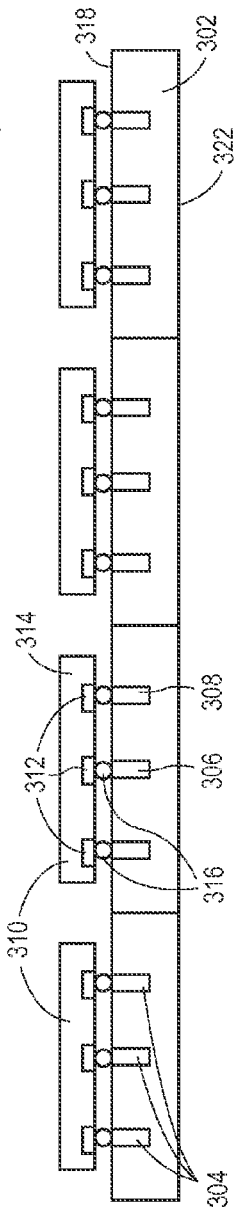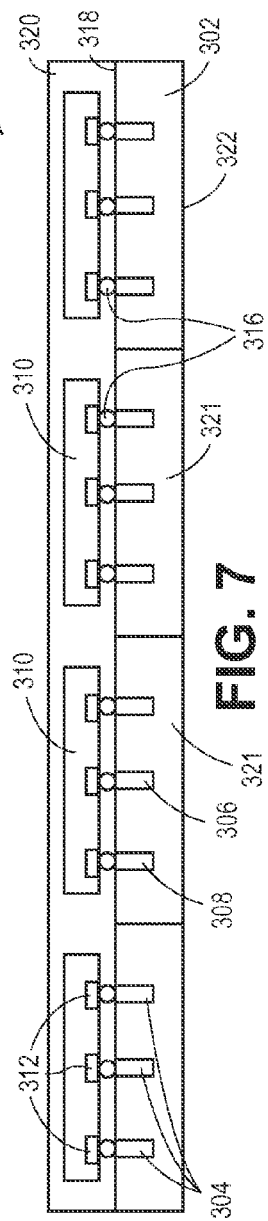

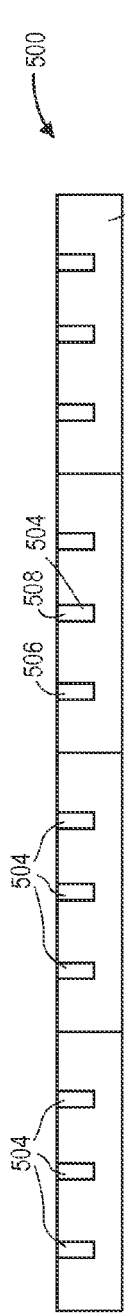
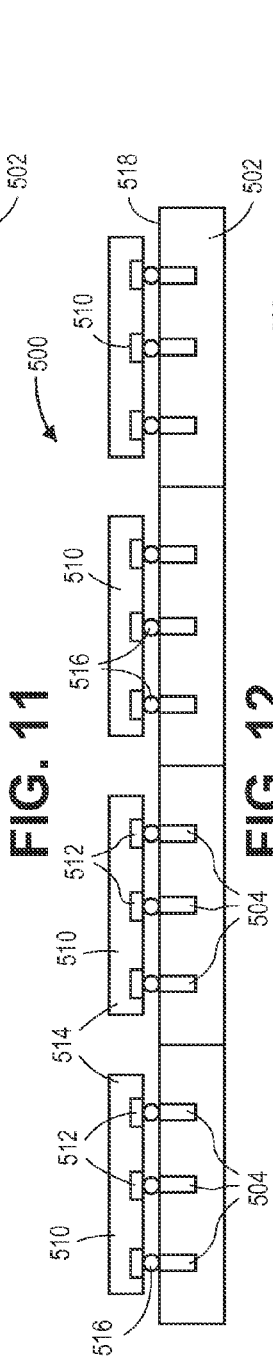
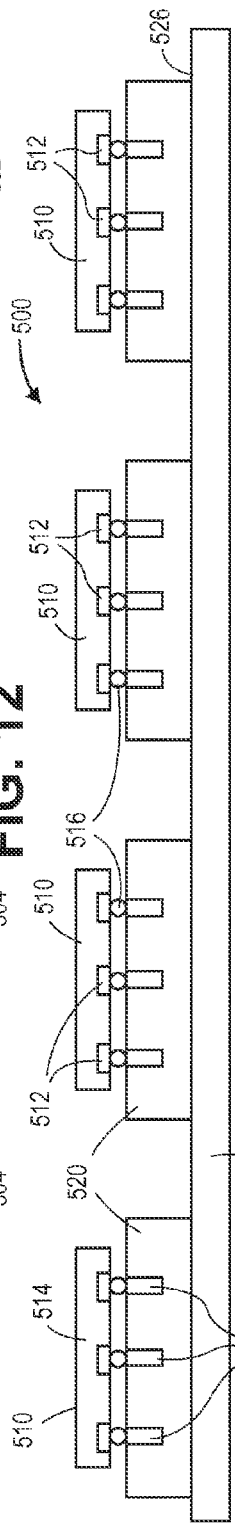
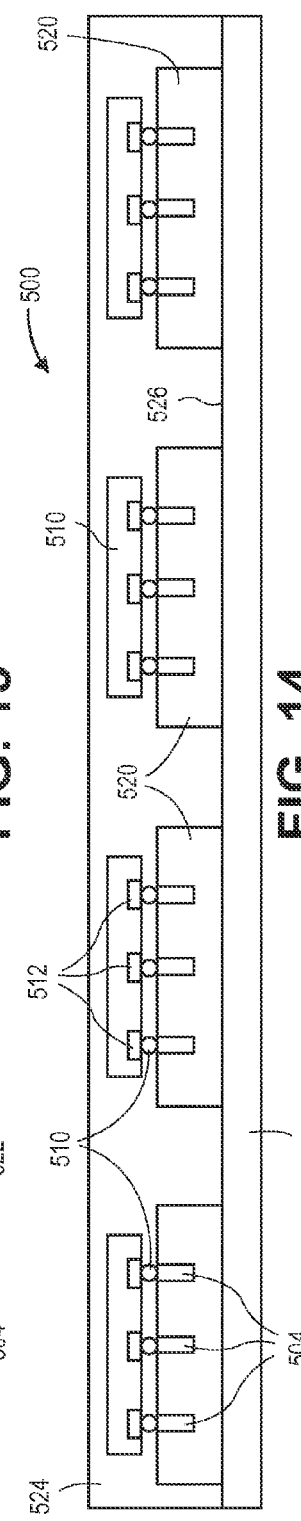
FIG. 11
FIG. 12
FIG. 13
FIG. 14

STACKED WAFER-LEVEL PACKAGE DEVICE

BACKGROUND

Multi-media devices, such as smart phones, mobile gaming devices, and so forth, utilize integrated circuitry that furnish various functionalities to multi-media devices. For example, the integrated circuitry may furnish processing functionality, storage functionality, and the like to these multi-media devices. However, multi-media devices continue to have greater functionality that requires a greater amount of integrated circuitry to execute the desired functionality (as well as for storage). For instance, multi-media devices may include multiple apps (e.g., applications) that are designed to perform singular or multiple related specific tasks. Each app requires access and the ability to utilize the circuitry for the apps' desired task.

SUMMARY

Wafer-level packaging techniques are described to allow packaging of multiple die into a single semiconductor package device. In an implementation, a stacked wafer-level package device includes a semiconductor device having at least one electrical interconnection formed therein. At least one semiconductor package device is positioned over the first surface of the semiconductor device. The semiconductor package device(s) include one or more micro-solder bumps. The wafer-level package device further includes an encapsulation structure disposed over and supported by the semiconductor device for encapsulating the semiconductor package device(s). When a semiconductor package device is positioned over the semiconductor device, each of the micro-solder bumps are connected to a respective electrical interconnection that are formed in the semiconductor device. The electrical interconnections provide electrical connectivity between the semiconductor package device and the semiconductor device.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

FIGS. 5 through 9 are diagrammatic partial cross-sectional views illustrating the fabrication of a stacked wafer-level package device, such as the device shown in FIG. 1, in accordance with the process shown in FIG. 4.

FIGS. 11 through 17 are diagrammatic partial cross-sectional views illustrating the fabrication of a stacked wafer-level package device, such as the device shown in FIG. 2, in accordance with the process shown in FIG. 10.

DETAILED DESCRIPTION

Overview

Figure 1:
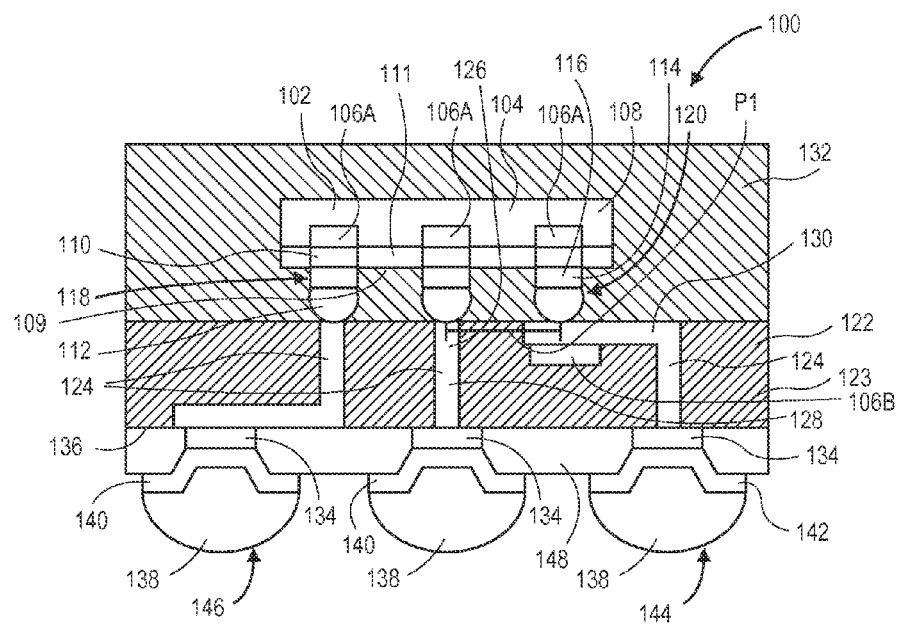
FIG. 1 is a diagrammatic partial cross-sectional view illustrating a stacked wafer-level package device in accordance with an example implementation of the present disclosure, wherein the package device is implemented in a non-fan-out package configuration.

Multi-media devices, such as smart phones, mobile gaming devices, and so forth, include semiconductor devices that employ integrated circuitry to provide functionality to multi-media devices. The multi-media devices may include varying numbers of apps that provide specific functionality and tasks to the multi-media devices. As the number of apps grows, a greater amount of processing functionality and storage functionality provided by the integrated circuitry may be required. However, the greater the number of circuitry may correlate to a greater amount of physical space required in the multi-media devices.

Accordingly, wafer-level packaging techniques are described to allow packaging of multiple die into a single wafer-level package device. The packaging of multiple die into a single wafer-level package device allows for an increased density in a smaller amount of physical space. In an implementation, a wafer-level package device includes a semiconductor device having at least one electrical interconnection formed therein. At least one semiconductor package device is positioned over the first surface of the semiconductor device and includes one or more micro-solder bumps. Thus, the semiconductor device is also configured as a carrier device for the wafer-level package device. The wafer-level package device further includes an encapsulation structure disposed over and supported by the semiconductor device for encapsulating the semiconductor package device(s). When a semiconductor package device is positioned over the semiconductor device, each of the micro-solder bumps are connected to a respective electrical interconnection that are formed in the semiconductor device. The electrical interconnections provide electrical connectivity between the semiconductor package device and the semiconductor device.

In implementations, the wafer-level package device may employ a non-fan-out configuration or a fan-out configuration. With regards to the non-fan-out package configuration, the number of inputs/outputs (I/Os) is directly related to the size of the semiconductor device (e.g., the carrier device). With regards to the fan-out package configuration, the number of I/Os is not a function of the size of the semiconductor device. Thus, a greater number of I/Os may be utilized with the fan-out package configuration.

Example Implementations

FIGS. 1 through 3D illustrate wafer-level package devices 100 in accordance with example implementations of the present disclosure. As shown, the wafer-level package devices 100 include one or more semiconductor package devices 102 (e.g., individual die package) comprised of a substrate 104 (e.g., silicon wafer, or the like) and one or more integrated circuits 106A formed therein. The integrated circuits 106A may be configured in a variety of ways. For example, the integrated circuits 106 may be comprised of digital circuitry. In another example, the integrated circuits 106 may be comprised of analog circuitry. The first semiconductor package devices 102 are encapsulated by a suitable protective packaging material 108 to minimize damage and/or corrosion to the integrated circuits 106A. In one or more implementations, the material 108 may be ceramic, plastic, epoxy, or the like. The first semiconductor package devices 102 further include one or more area arrays of contact pads 110 deployed over a surface 109 of the semiconductor package device 102. The number and configuration of contact pads 110 may vary depending on the complexity and configuration of the integrated circuits 106A, the size and shape of the substrate 104, and so forth. The contact pads 110 provide electrical contacts through which the integrated circuits 106A are interconnected to external components such as other semiconductor devices, printed circuit boards, and so forth. The contact pads 110 may be formed in a dielectric layer 111. The dielectric layer 111 may comprise benzocyclobutene polymer (BCB), Polyimide (PI), Polybenzoxazole (PBO), silicon dioxide ($SiO_2$), and so forth.

One or more micro-solder bumps 112 are provided to furnish mechanical and/or electrical interconnection between the contact pads 110 and corresponding electrical interconnections described herein. In one or more implementations, the micro-solder bumps 112 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, a Cu pillar bump, and so on. However, it is contemplated that Tin-Lead (PbSn) solders may be used. The diameter of the micro-solder bumps 112 may be about forty (40) micrometers to about two hundred (200) micrometers. The pitch (P1) of the micro-solder bumps 112 may be about sixty (60) micrometers to about three hundred (300) micrometers.

Bump interfaces 114 may be applied to the contact pads 110 of the first semiconductor package devices 102 to provide a reliable interconnect boundary between the contact pads 110 and the micro-solder bumps 112. For instance, in the device 102 shown in FIG. 1, the bump interface 114 comprises under-bump metallization (UBM) 116 applied to the contact pads 110 of the first semiconductor package devices 102. The UBM 116 may have a variety of compositions. For example, the UBM 116 include multiple layers of different metals (e.g., Aluminum (Al), Titanium (Ti), Nickel (Ni), Copper (Cu), etc.) that function as an adhesion layer, a diffusion barrier layer, a solderable layer, an oxidation barrier layer, and so forth. However, other UBM structures are possible.

Viewed together, the micro-solder bumps 112 and associated bump interfaces 114 (e.g., UBM 116) comprise bump assemblies 118 that are configured to provide mechanical and/or electrical interconnection of the semiconductor package device 102 to the printed corresponding electrical interconnections. As illustrated in FIGS. 1 through 3D, the semiconductor package device 102 may include one or more arrays 120 of bump assemblies 118 depending on various design considerations.

As shown in FIG. 1, the wafer-level package device 100 further includes a semiconductor device 122 that is comprised of a substrate 123. In an implementation, the semiconductor device 122 functions as a carrier device for the semiconductor package device 102. The semiconductor device 122 may also include one or more integrated circuits 106B formed in the substrate 123. As described above, the integrated circuits 106B may be digital integrated circuits and/or analog integrated circuits. In an implementation, the integrated circuit 106B may be of the same type of circuitry as the integrated circuit 106A. For instance, the integrated circuit 106A and the integrated circuit 106B may be digital circuits or analog circuits. In another implementation, the integrated circuit 106A and the integrated circuit 106B may comprise different types of circuitry. For instance, the integrated circuit 106A may be a digital circuit while the integrated circuit 106B may be an analog circuit, or vice versa. Therefore, the integrated circuits 106A, 106B may provide complementary functionality between each other (or other circuitry). The semiconductor device 122 may be greater in size than the semiconductor device 104 so as to provide support to the device 104 during fabrication and device 100 usage.

The semiconductor device 122 also includes one or more electrical interconnections 124 formed in the substrate 123 (e.g., a portion of a silicon wafer, or the like) and configured to provide electrical connectivity between the first semiconductor package device 102 and the semiconductor device 122. The electrical interconnections 124 may be configured in a variety of ways. In an implementation, the electrical interconnections 124 may be micro-through-silicon vias (TSVs) 126 with a conductive material 128 (e.g., copper, poly-silicon, etc.) deposited therein. The micro-TSVs 126 may have an approximate size from about ten (10) micrometers to about fifty (50) micrometers and an approximate depth from about fifty (50) micrometers to about one hundred and fifty (150) micrometers. In another implementation, the electrical interconnections 124 may be a redistribution layer (RDL) structure 130 comprised of a thin-film (e.g., aluminum, copper, etc.) rerouting and interconnection system that redistributes electrical interconnections in the devices 122. In yet another implementation, the electrical interconnections 124 may be a combination of the micro-TSVs and the RDL structure 130.

Figure 2:
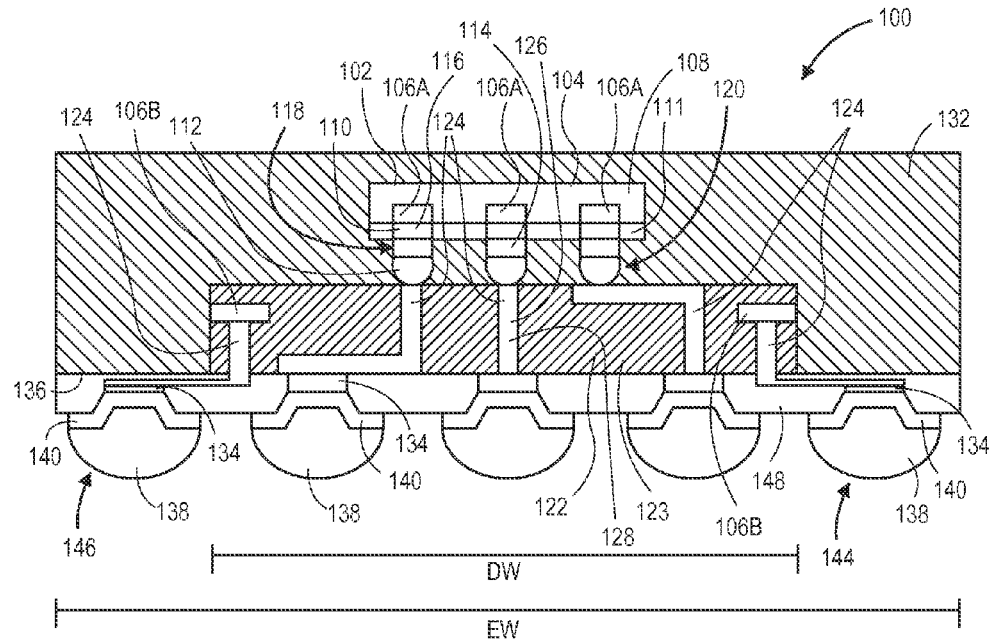
FIG. 2 is diagrammatic partial cross-sectional views illustrating another stacked wafer-level package device in accordance with an example implementation of the present disclosure, wherein the package device is implemented in a fan-out package configuration.

As illustrated in FIGS. 1 and 2, the semiconductor package device 102 is stacked over the semiconductor device 122 so that the micro-solder bumps 112 are in contact with the electrical interconnections 124 of the semiconductor device 122. In an implementation, the micro-solder bumps 112 are in contact with the micro-TSVs 126. In another implementation, the micro-solder bumps 112 are in contact with the RDL structure 130. Thus, the integrated circuits 106A, 106B may communicate with one another and provide greater functionality to the wafer-level package device 100.

The device 100 further includes an encapsulation structure 132 that encapsulates, at least substantially, the semiconductor package device 102 and is supported by the semiconductor device 122. The encapsulation structure 132 is configured to encapsulate the semiconductor package device 102. The encapsulation structure 132 may comprise ceramic, plastic, epoxy, or the like. The semiconductor device 122 includes one or more area arrays of contact pads 134 deployed over a surface 136 of the device 122. The number and configuration of contact pads 134 may vary depending on the complexity and configuration of the integrated circuits 106B, the size and shape of the substrate 123, and so forth. The contact pads 134 provide electrical contacts through which the integrated circuits 106B are interconnected to external components such as other semiconductor devices, printed circuit boards, and so forth.

One or more solder bumps 138 are provided to furnish mechanical and/or electrical interconnection between the contact pads 134 and corresponding electrical interconnections described here. In one or more implementations, the solder bumps 138 may be fabricated of a lead-free solder such as a Tin-Silver-Copper (Sn—Ag—Cu) alloy solder (i.e., SAC), a Tin-Silver (Sn—Ag) alloy solder, a Tin-Copper (Sn—Cu) alloy solder, and so on. However, it is contemplated that Tin-Lead (PbSn) solders may be used. The diameter of the solder bumps 138 may be about one hundred (100) micrometers to about three hundred and fifty (350) micrometers. The pitch (P2) of the solder bumps 138 may be about three hundred (300) micrometers to about six hundred and fifty (650) micrometers.

Bump interfaces 140 may be applied to the contact pads 134 of the semiconductor devices 122 to provide a reliable interconnect boundary between the contact pads 134 and the solder bumps 138. For instance, in the semiconductor device 122 shown in FIG. 1, the bump interface 140 comprises under-bump metallization (UBM) 142 applied to the contact pads 134 of the second semiconductor devices 122. The UBM 142 may have a variety of compositions. For example, the UBM 142 includes multiple layers of different metals (e.g., Aluminum (Al), Titanium (Ti), Nickel (Ni), Copper (Cu), etc.) that function as an adhesion layer, a diffusion barrier layer, a solderable layer, an oxidation barrier layer, and so forth. However, other UBM structures are possible. In other implementations, the semiconductor devices 122 may not include solder bumps. Instead, the semiconductor devices 122 may utilize land grid array surface-mount packaging technologies to interface with other electronic components.

Viewed together, the solder bumps 138 and associated bump interfaces 140 (e.g., UBM 142) comprise bump assemblies 144 that are configured to provide mechanical and/or electrical interconnection of the first semiconductor device 122 to the printed corresponding electrical interconnections. As illustrated in FIGS. 1 through 3D, the semiconductor device 122 may include one or more arrays 146 of bump assemblies 144 depending on various design considerations. The bump assemblies 144 may be formed proximate to one or more dielectric layers 148. The dielectric layers 148 may be comprised of various materials. For example, the layers 148 may be benzocyclobutene polymer (BCB), Polyimide (PI), Polybenzoxazole (PBO), silicon dioxide ($SiO_2$), and so forth.

FIG. 1 illustrates a wafer-level package device 100 having a non-fan-out package configuration where the number of inputs/outputs (I/Os) (e.g., number of solder bumps 138) is a direct function of the die size of the wafer-level package device 100. However, FIG. 2 illustrates a wafer-level package device 100 having a fan-out package configuration where the number of I/Os is not a function of the die size of the wafer-level package device 100. The wafer-level package devices 100 having the fan-out package configuration may be fabricated utilizing suitable embedding processes described below. As shown, the encapsulating structure 132 extends (EW) beyond the width (DW) of the die (e.g., the width of the semiconductor device 122) to allow for a greater number of solder bumps 138 over the surface 136. For instance, solder bumps 138 may be positioned on the encapsulating structure 132 portions that extend beyond the semiconductor device 122. Thus, bump interfaces 140 may be formed over the encapsulating structure 132 portion that extends beyond the width (DW) of the semiconductor device 122 to provide connectivity to those solder bumps 138 formed over the encapsulating structure 132 portions extending beyond the semiconductor device 122.

It is understood the size of the semiconductor package device 102 may vary with respect to the size of the semiconductor device 122. For example, the width of the semiconductor package device 102 may be less than the width of the semiconductor device 122. In another example, the width of the semiconductor package device 102 may be about the same as the width of the semiconductor device 122.

Figure 3A:
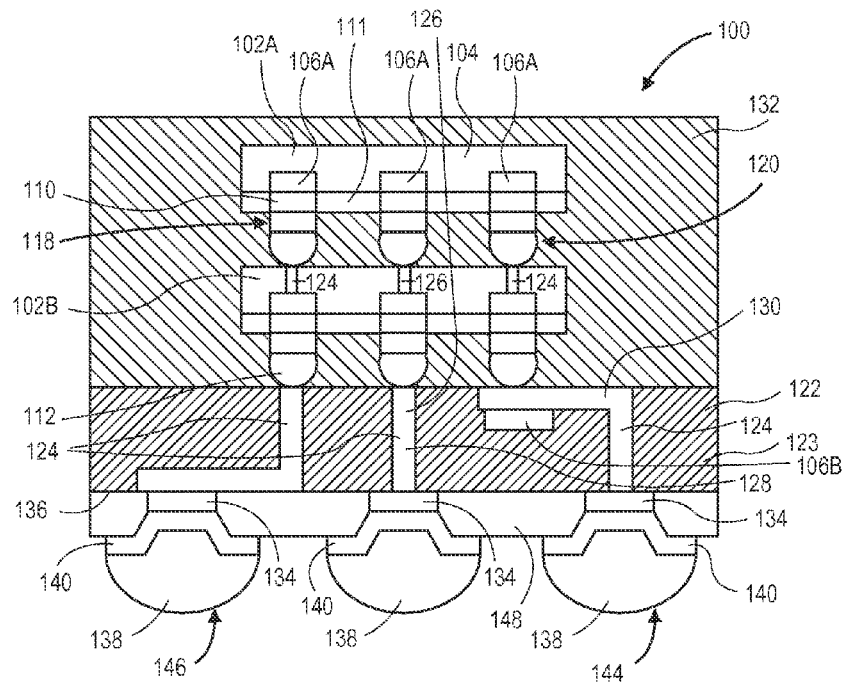
FIG. 3A is a diagrammatic partial cross-sectional view illustrating the wafer-level package device shown in FIG. 1, wherein the device is illustrated as including a first semiconductor package device stacked over a second semiconductor package device.
Figure 3B:
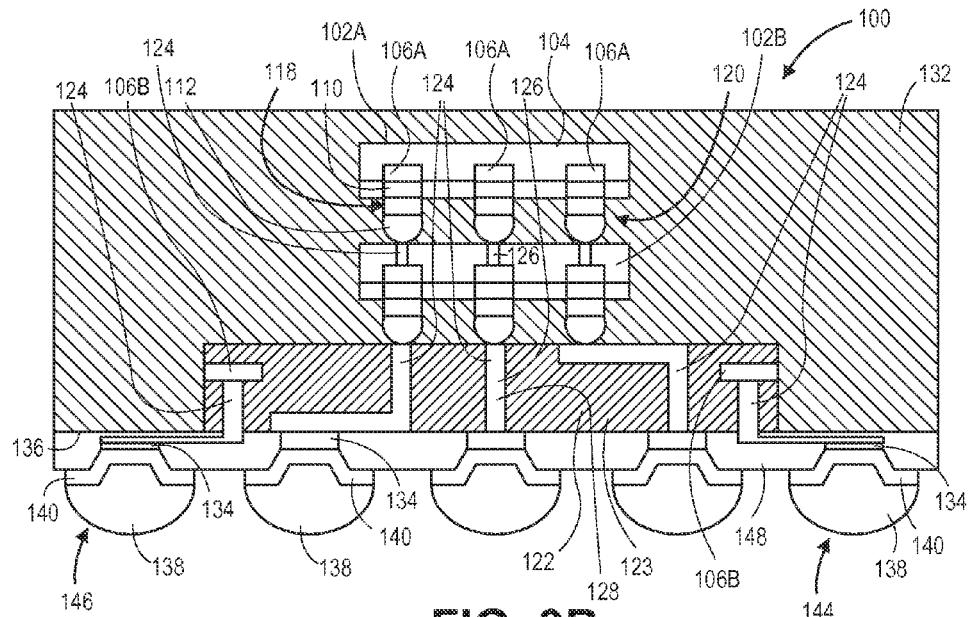
FIG. 3B is a diagrammatic partial cross-sectional view illustrating the wafer-level package device shown in FIG. 2, wherein the device is illustrated as including a first semiconductor package device stacked over a second semiconductor package device.

While FIGS. 1 and 2 only illustrate a single semiconductor package device 102 stacked over the semiconductor device 122. FIGS. 3A and 3B illustrate a multiple device stacked configuration. For instance, the wafer-level package device 100 may include a first semiconductor package device 102A stacked over a second semiconductor package device 102B, and the second semiconductor package device 102B is stacked over the semiconductor device 122. In this implementation, the second semiconductor package device 102B includes one or more electrical interconnections 124 formed therein to allow the integrated circuits 106A of the first semiconductor device 102A to communicate with the integrated circuits 106A of the second semiconductor device 106B and/or the integrated circuits 106B of the semiconductor device 122 through the micro-solder bumps 112 of the first semiconductor device 102A. In one or more implementations, the electrical interconnections 124 may be a micro-TSV 126, a RDL structure 130, combinations of both, or the like.

Figure 3C:
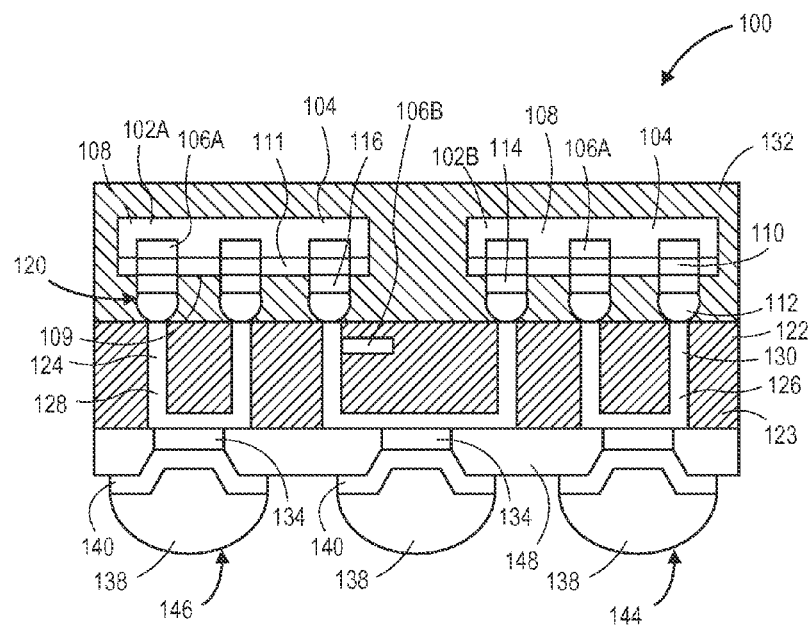
FIG. 3C is a diagrammatic partial cross-sectional view illustrating the wafer-level package device shown in FIG. 1, wherein the device is illustrated as including a first semiconductor package device stacked side-by-side with a second semiconductor package device.
Figure 3D:
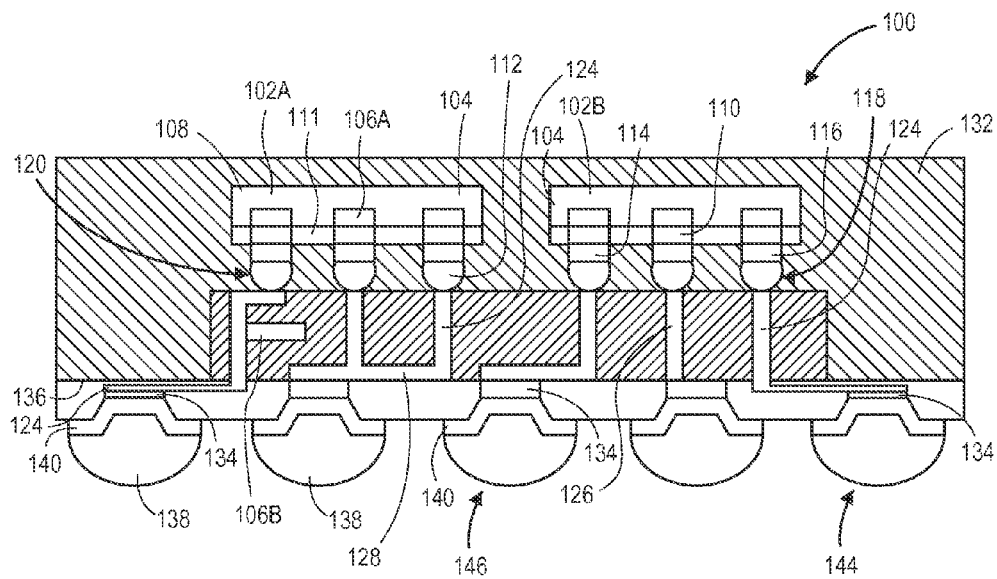
FIG. 3D is a diagrammatic partial cross-sectional view illustrating the wafer-level package device shown in FIG. 2, wherein the device is illustrated as including a first semiconductor package device stacked side-by-side with a second semiconductor package device.

FIGS. 3C and 3D illustrate another wafer-level package device 100 configuration. As illustrated, the first semiconductor package device 102A and the second semiconductor package device 102B are both stacked over the semiconductor device 122 in a side-by-side package configuration. Thus, both semiconductor package devices 102A, 102B may communicate with the semiconductor device 122 through the electrical interconnections 124 formed in the device 122.

Example Fabrication Processes

Figure 4:
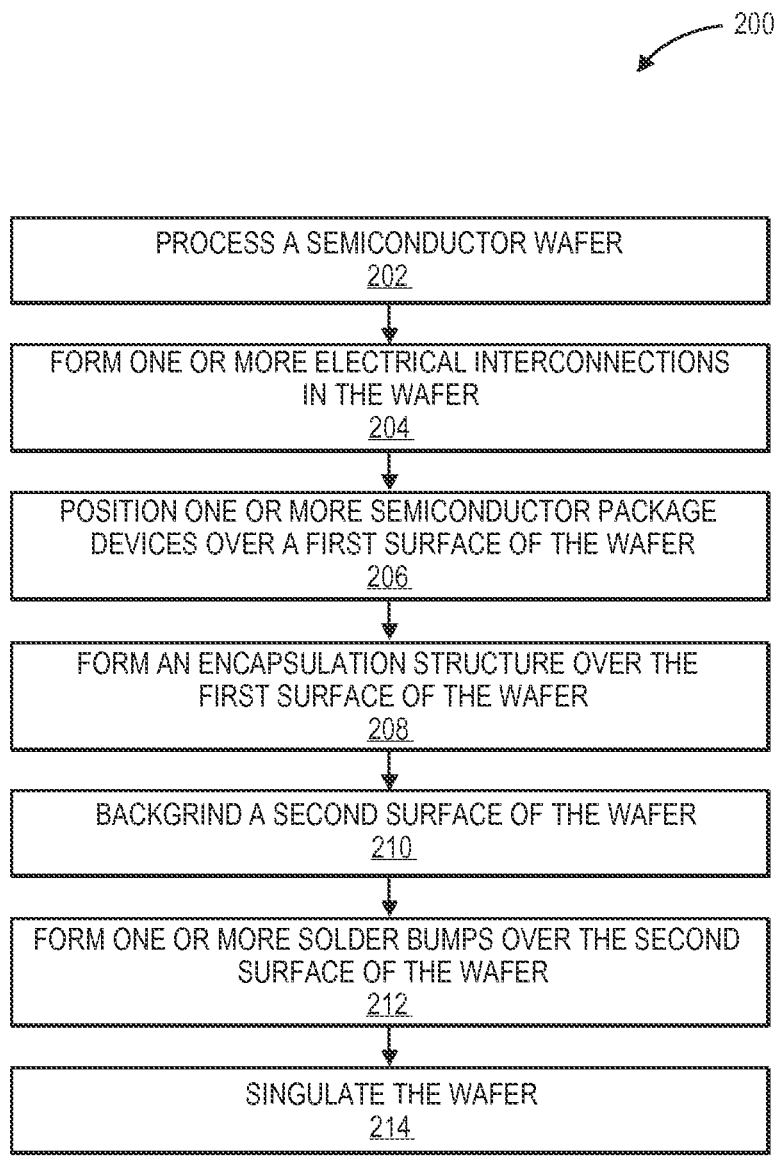
FIG. 4 is a flow diagram illustrating a process in an example implementation for fabricating stacked wafer-level package devices, such as the device shown in FIG. 1.

FIG. 4 illustrates an example process 200 that employs wafer-level packaging techniques to fabricate wafer-level package devices 300 having a non-fan-out configuration. As shown, a semiconductor wafer (e.g., substrate) is first processed (Block 202) to form integrated circuits therein. The integrated circuits may be configured in a variety of ways. For example, the integrated circuits may be digital integrated circuits, analog integrated circuits, mixed-signal integrated circuits, and so forth. In one or more implementations, front-end-of-line techniques may be utilized to form the integrated circuits in the semiconductor wafer, such as the wafer 302 illustrated in FIG. 5. One or more electrical interconnections are then formed in the wafer (Block 204). The electrical interconnections are configured to provide electrical connectivity between various electrical components, such as integrated circuitry. As shown in FIG. 5, the electrical interconnections 304 may be micro-through-silicon vias (TSVs) 306 with a conductive material 308 (e.g., copper, poly-silicon, etc.) deposited therein. The conductive material 308 may be deposited through suitable deposition process, such as a copper damascene process, or the like. In one or more implementations, the micro-TSVs 306 may have an approximate size from about ten (10) micrometers to about fifty (50) micrometers and an approximate depth from about fifty (50) micrometers to about one hundred and fifty (150) micrometers. In another implementation, the electrical interconnections 304 may be a redistribution (RDL) structure as described above with reference to FIGS. 1 through 3D.

Once the electrical interconnections are formed, one or more semiconductor package devices are positioned over a first surface of the wafer (Block 206). As shown in FIG. 6, the semiconductor package devices 310 include integrated circuits 312. The integrated circuits 312 may also comprise digital circuitry, analog circuitry, mixed-signal circuitry, or the like. The semiconductor package devices 310 further include protective packaging material 314 that encapsulates the integrated circuits 312 to minimize damage and/or corrosion to the integrated circuits 312. In one or more implementations, the material 314 may be ceramic, plastic, epoxy, or the like. The semiconductor package devices 310 also include one or more micro-solder bumps 316, such as the micro-solder bumps 112 described above with respect to FIGS. 1 through 3D. As shown, the semiconductor package devices 310 may be positioned over the first surface 318 of the wafer 302 so that the micro-solder bumps 316 may be in contact with the electrical connections 304. In an implementation, the electrical interconnections 304 provide electrical connectivity between the integrated circuits 312 and the integrated circuits (not shown) formed in the wafer 302.

An encapsulation structure is then formed over the first surface of the wafer (Block 208). As illustrated in FIG. 7, the encapsulation structure 320 may be formed over the first surface 318 so that the structure 320 at least substantially encapsulates the semiconductor package devices 310. In one or more implementations, the encapsulation structure 320 may be comprised of an encapsulation material deposited over the surface 318. In one or more implementations, the structure 320 may comprise one or more polymers, such as an epoxy material, or the like. The structure 320 serves to insulate the semiconductor package devices 310 and to at least substantially keep the devices 310 in place with respect to the wafer 302 (and respective semiconductor devices 321 when wafer 302 has been singulated).

Figure 8:
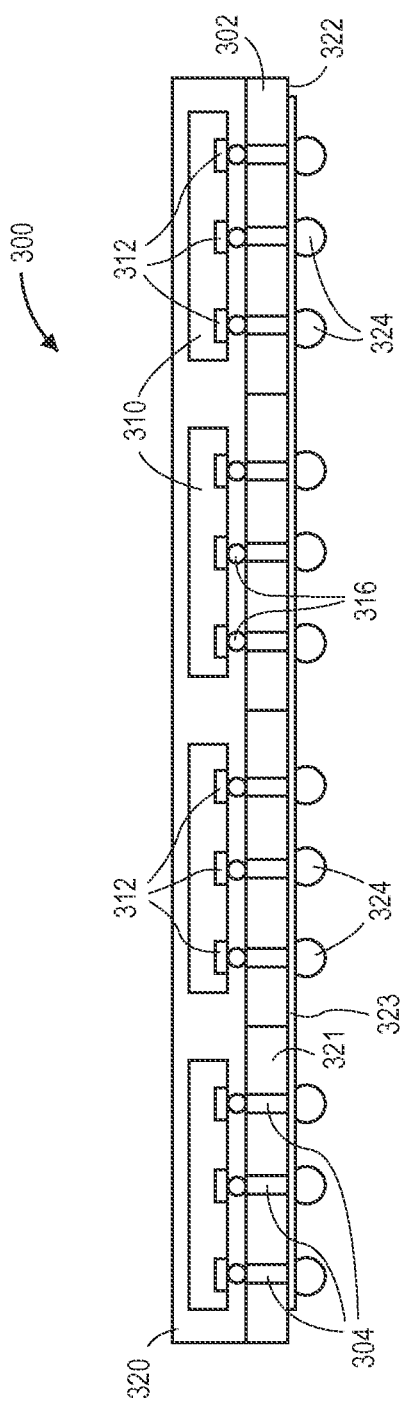

A second surface of the wafer is then subjected to a backgrinding process (Block 210). As shown in FIG. 8, a second surface 322 of the wafer 302 is then subjected to a backgrinding process to at least partially expose the electrical interconnections 304 (e.g., micro-TSVs 306, etc.) for further processing steps. Once the electrical interconnections are at least partially exposed, one or more solder bumps are formed over the second surface of the wafer (Block 212). A dielectric layer 323 may first be formed over the surface 322. In an implementation, the dielectric layer 323 may be benzocyclobutene polymer (BCB), Polyimide (PI), Polybenzoxazole (PBO), silicon dioxide ($SiO_2$), and so forth. The solder bumps 324 may be formed over the second surface 322 of the wafer 302 through a suitable reflow process. In one or more implementations, the electrical interconnections 304 provide electrical connectivity between the integrated circuits 312, the integrated circuits formed within the wafer 302, and/or the solder bumps 324. The solder bumps 324 may be formed over one or more electrical interconnections 326 that provide electrical connectivity between the electrical interconnections 304 and the solder bumps 324. In one or more implementations, the electrical interconnections 326 may comprise bump interfaces, such as bump interfaces 140 described above with respect to FIGS. 1 through 3D. For example, the bump interfaces may comprise a UBM structure 328, or the like. As described above, in some implementations the semiconductor devices 321 may instead utilize land grid array technology to communicate with other electronic components.

The wafer is then subjected to a singulation process (Block 214) to singulate the wafer into one or more individual die.

Figure 9:
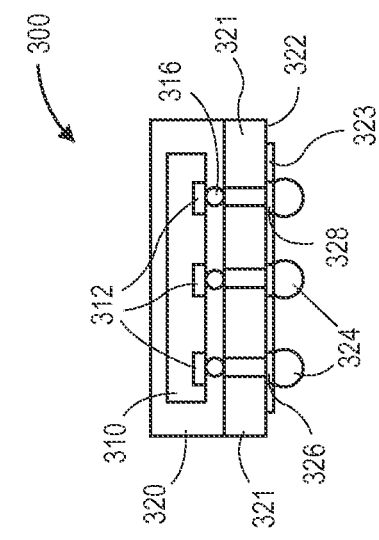

Once the wafer 302 is singulated (see FIG. 9), the device 300 may comprise the semiconductor package device 310 positioned over the surface 318 of the singulated portion (e.g., individual die) of the wafer 302 and at least substantially encapsulated by the material 320. The device 310 may be positioned so that the micro-solder bumps 316 are in contact with the electrical interconnections 304 of the device 300. The encapsulated semiconductor device 310 and the singulated portion of the wafer 302 may be viewed as a stacked chip-scale package (CSP) device having a non-fan-out configuration. It is contemplated that in some implementations the wafer may be singulated prior to depositing of the encapsulation material as described with respect to Block 208.

Figure 10:
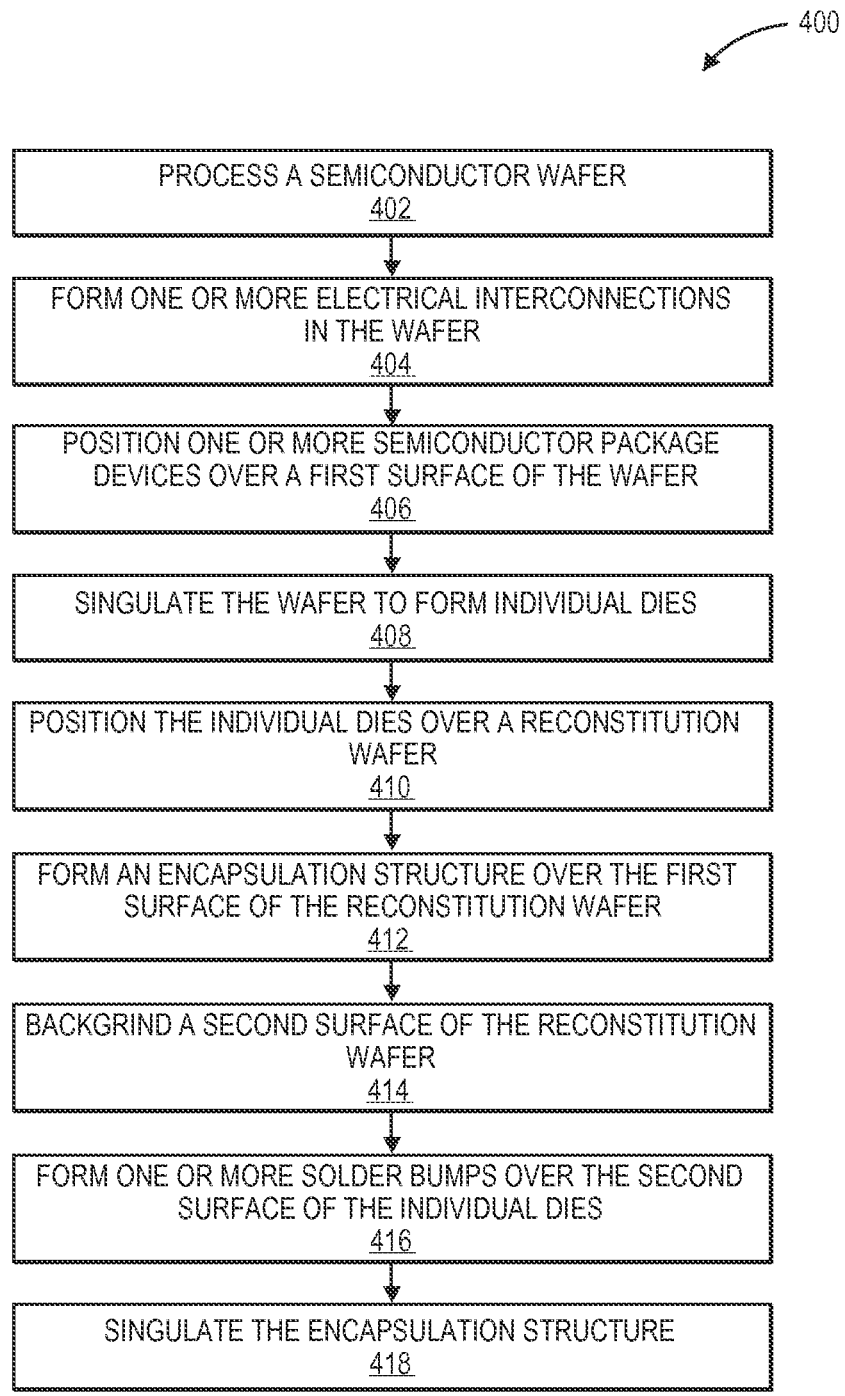
FIG. 10 is a flow diagram illustrating a process in an example implementation for fabricating stacked wafer-level package devices, such as the device shown in FIG. 2.

FIG. 10 illustrates an example process 400 that employs wafer-level packaging techniques to fabricate wafer-level package devices 500 having a fan-out configuration. As shown, a semiconductor wafer (e.g., substrate) is first processed (Block 402) to form integrated circuits therein. The integrated circuits may be configured in a variety of ways. For example, the integrated circuits may be digital integrated circuits, analog integrated circuits, mixed-signal integrated circuits, and so forth. In one or more implementations, front-end-of-line techniques may be utilized to form the integrated circuits in the semiconductor wafer, such as the wafer 502 illustrated in FIG. 11. One or more electrical interconnections are then formed in the wafer (Block 404). The electrical interconnections are configured to provide electrical connectivity between various electrical components, such as integrated circuitry. As shown in FIG. 11, the electrical interconnections 504 may be micro-through-silicon vias (TSVs) 506 with a conductive material 508 (e.g., copper, poly-silicon, etc.) deposited therein. The conductive material 508 may be deposited through suitable deposition process, such as a copper damascene process, or the like. In one or more implementations, the micro-TSVs 506 may have an approximate size from about ten (10) micrometers to about fifty (50) micrometers and an approximate depth from about fifty (50) micrometers to about one hundred and fifty (150) micrometers. In another implementation, the electrical interconnections 504 may be a redistribution (RDL) structure as described above with reference to FIGS. 1 through 3D.

Once the electrical interconnections are formed, one or more semiconductor package devices are positioned over a first surface of the wafer (Block 406). As shown in FIG. 12, the semiconductor package devices 510 include integrated circuits 512. The integrated circuits 512 may also comprise digital circuitry, analog circuitry, mixed-signal circuitry, or the like. The semiconductor package devices 510 further include protective packaging material 514 that is configured to protect the integrated circuits 512 from further semiconductor fabrication processes (e.g., protect the integrated circuits 512 from the encapsulation process described herein) and/or corrosion. In one or more implementations, the protective packaging material 514 may be ceramic, plastic, epoxy, or the like. The semiconductor package devices 510 also include one or more micro-solder bumps 516, such as the micro-solder bumps 112 described above with respect to FIGS. 1 through 3D. The semiconductor package devices 510 may be positioned over the first surface 518 of the wafer 502 so that the micro-solder bumps 516 are in contact with the electrical connections 504. In an implementation, the electrical interconnections 504 provide electrical connectivity between the integrated circuits 512 and the integrated circuits (not shown) formed in the wafer 502.

The wafer is then subjected to a singulation process (Block 408) to singulate the wafer into one or more individual die. The individual dies are then positioned over a reconstitution wafer (Block 410). As shown in FIG. 13, the individual semiconductor devices 520 are positioned over the reconstitution wafer 522. In one or more implementations, the reconstitution wafer 522 may be any type of sacrificial wafer, such as a silicon wafer, an organic wafer, or the like.

An encapsulation structure is then formed over a first surface of the wafer (Block 412). As shown in FIG. 14, the encapsulation structure 524 may be formed over the first surface 526 of the reconstitution wafer 522 so that the structure 524 at least substantially encapsulates the semiconductor package devices 510. In one or more implementations, the encapsulation structure 524 may be comprised of an encapsulation material deposited over the surface 526. In one or more implementations, the structure 524 comprises a polymer, such as an epoxy material, or the like. The structure 524 serves to insulate the semiconductor package devices 510 and to at least substantially keep the devices 510 in place with respect to the semiconductor device 520.

Figure 15:
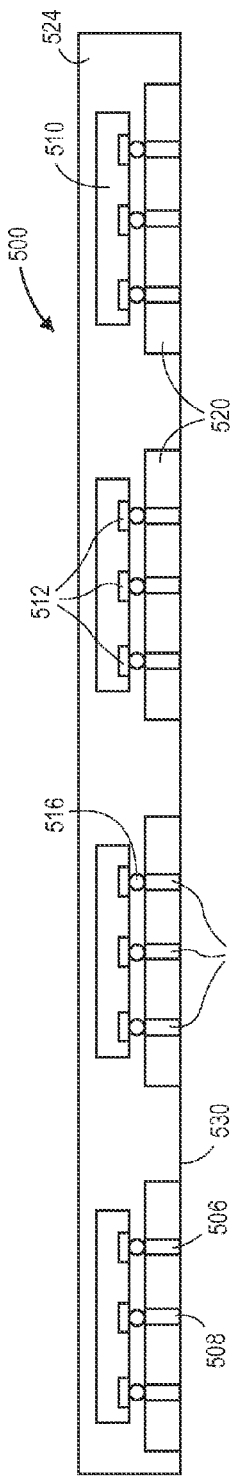
Figure 16:
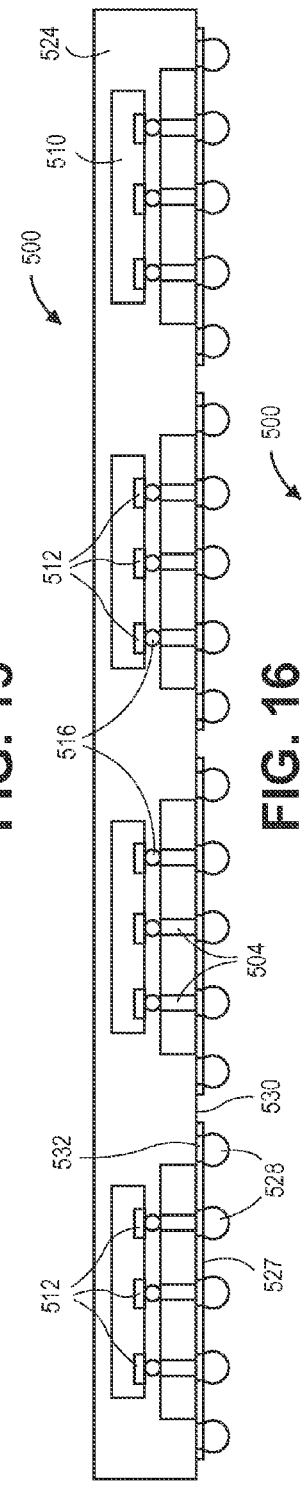

A reconstitution wafer is then subjected to a backgrinding process (Block 414). The reconstitution wafer 522 and a portion of each semiconductor device 520 are subjected to a suitable backgrinding process to at least partially expose the electrical interconnections 504 of each semiconductor device 520 (see FIG. 15). Once the electrical interconnections have been at least partially exposed, one or more solder bumps are formed over a surface of the dies (Block 416). A dielectric layer 527 may first be formed over the surface 530. In an implementation, the dielectric layer 527 may be benzocyclobutene polymer (BCB), Polyimide (PI), Polybenzoxazole (PBO), silicon dioxide ($SiO_2$), and so forth. The solder bumps 528 are formed over the surface 530 of the semiconductor devices 520 proximate to the at least partially exposed electrical interconnections 504 as shown in FIG. 16. The solder bumps 528 are formed utilizing a suitable reflow process. In one or more implementations, the solder bumps 528 may be formed over one or more electrical interconnections 532 that are disposed over the surface 530 and in the dielectric layer 527. As described above, the electrical interconnections 532 may be bump interfaces, or the like. In one or more implementations, a first solder bump 528 may be connected to a first electrical interconnection 532 (e.g., the first electrical interconnection 532 is dedicated to the first solder bump 528), a second solder bump 528 may be connected to a second electrical interconnection 532, a third solder bump 528 may be connected to a third electrical interconnection 532, and so forth.

Figure 17:
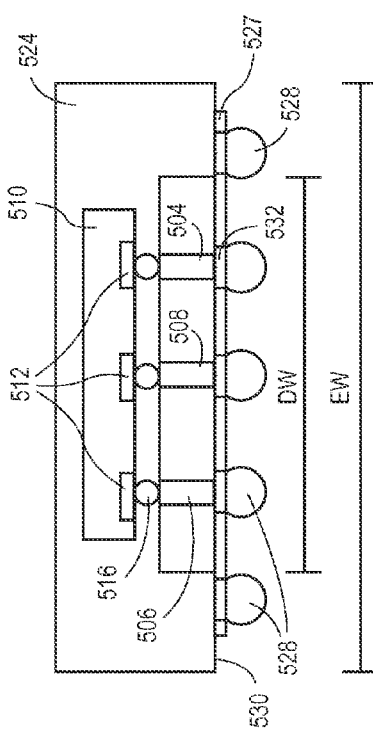

The encapsulation structure is then subjected to a singulation process (Block 418) to singulate the encapsulation structure into individual stacked die (e.g., stacked semiconductor package devices). As shown in FIG. 17, once singulated, the width (EW) of the encapsulation structure 524 is greater than the width (DW) of the semiconductor device 520. This allows the electrical interconnection 532 to at least partially extend over the encapsulation structure 524 portion as well (as compared to the device 300 where the electrical interconnection 326 can only extend over the width of the semiconductor device 321). Thus, this configuration (e.g., fan-out configuration) allows for a greater number of solder bumps 528 and hence, a greater number of input/outputs (I/Os) for the device 500. The device 500 comprises a stacked CSP device having a fan-out configuration.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. A wafer-level package device comprising:
   a semiconductor device having at least one electrical interconnection and at least one integrated circuit formed therein, the semiconductor device including a first surface and a second surface, where the at least one electrical interconnection includes at least one micro-through-silicon-via, where the at least one micro-through-silicon via has a size from ten (10) micrometers to fifty (50) micrometers and a depth from fifty (50) micrometers to one hundred and fifty (150) micrometers;
   a semiconductor package device positioned over the first surface of the semiconductor device;
   at least one micro-solder bump coupled to the semiconductor package device and coupled to the micro-through-silicon via; and
   a single encapsulation structure supported by the semiconductor device that encapsulates all sides of the semiconductor package device including a side of the semiconductor package device that is distal from the semiconductor device, where the encapsulation structure includes a polymer, and where the encapsulation structure abuts the semiconductor device including at least one integrated circuit,
   wherein the at least one micro-solder bump is in contact with the at least one electrical interconnection when the semiconductor package device is positioned over the first surface of the semiconductor device and the at least one electrical interconnection is configured to provide electrical connectivity to the semiconductor package device.

2. The wafer-level package device as recited in claim 1, further comprising at least one solder bump disposed over the second surface of the semiconductor device.

3. The wafer-level package device as recited in claim 2, wherein the at least one electrical interconnection is configured to provide electrical connectivity between the semiconductor package device and the at least one solder bump of the semiconductor device.

4. The wafer-level package device as recited in claim 1, wherein the at least one electrical interconnection is configured to provide electrical connectivity between the semiconductor package device and an integrated circuit formed within the semiconductor device.

5. The wafer-level package device as recited in claim 1, wherein the at least one electrical interconnection is a redistribution layer structure.

6. The wafer-level package device as recited in claim 1, wherein the width of the semiconductor package device is less than the width of the semiconductor device.

7. The wafer-level package device as recited in claim 1, wherein the at least one micro-solder bump has a diameter from about forty (40) micrometers to about two hundred (200) micrometers and a pitch of about sixty (60) micrometers to about three hundred (300) micrometers.

8. A wafer-level package device comprising:
   a semiconductor device having at least one electrical interconnection and at least one integrated circuit formed therein, the semiconductor device including a first surface and a second surface and having a first width, where the at least one electrical interconnection includes at least one micro-through-silicon-via, where the at least one one micro-through-silicon via has a size from ten (10)

micrometers to fifty (50) micrometers and a depth from fifty (50) micrometers to one hundred and fifty (150) micrometers;

a semiconductor package device positioned over the first surface of the semiconductor device;

at least one micro-solder bump coupled to the semiconductor package device in a fan-out package configuration and coupled to at least one micro-through-silicon via; and a single encapsulation structure supported by the semiconductor device for encapsulating the semiconductor package device, the encapsulation structure having a second width, the second width is greater than the first width, the encapsulation structure encapsulating all sides of the semiconductor package device including a side distal from the semiconductor device, and where the encapsulation structure abuts the semiconductor device including at least one integrated circuit, wherein the at least one micro-solder bump is in contact with the at least one electrical interconnection when the semiconductor package device is positioned over the first surface of the semiconductor device and the at least one electrical interconnection is configured to provide electrical connectivity to the semiconductor package device.

9. The wafer-level package device as recited in claim 8, further comprising at least one solder bump disposed over the second surface of the semiconductor device.

10. The wafer-level package device as recited in claim 9, wherein the at least one electrical interconnection is configured to provide electrical connectivity between the semiconductor package device and the at least one solder bump of the semiconductor device.

11. The wafer-level package device as recited in claim 8, wherein the at least one electrical interconnection is configured to provide electrical connectivity between the semiconductor package device and an integrated circuit formed within the semiconductor device.

12. The wafer-level package device as recited in claim 8, wherein the at least one electrical interconnection is a redistribution layer structure.

13. The wafer-level package device as recited in claim 8, wherein the width of the semiconductor package device is less than the width of the semiconductor device.

14. A process comprising:
receiving a semiconductor wafer, the semiconductor wafer processed to form one or more integrated circuits in a first surface of the semiconductor wafer;
forming one or more electrical interconnections in the semiconductor wafer, where the one or more electrical interconnections include at least one micro-through-silicon-via, where the at least one micro-through-silicon via has a size from ten (10) micrometers to fifty (50) micrometers and a depth from fifty (50) micrometers to one hundred and fifty (150) micrometers;
positioning one or more semiconductor package devices over the first surface of the semiconductor wafer using at least one micro-solder bump, where the micro-solder bump is coupled to the semiconductor wafer and at least one micro-through-silicon via; and
forming a single encapsulation structure over the first surface of the semiconductor wafer to encapsulate the one or more semiconductor package devices, where the encapsulation structure encapsulates all sides of the semiconductor package device including a side distal from the semiconductor device, and where the encapsulation structure includes a polymer.

15. The process as recited in claim 14, further comprising:
backgrinding a second surface of the semiconductor wafer to at least partially expose the one or more electrical interconnections;
forming one or more solder bumps over the second surface; and
singulating the semiconductor wafer to form one or more dies,
wherein each die of the one or more dies includes portion of the semiconductor wafer and a semiconductor package device positioned over the first surface, the semiconductor package device encapsulate by the encapsulation structure.

16. The process as recited in claim 14, wherein a width of the encapsulation structure is greater than a width of the associated die.

17. The process as recited in claim 14, wherein the one or more electrical interconnections comprise a micro-through-silicon via having a size from about ten (10) micrometers to about fifty (50) micrometers and a depth from about fifty (50) micrometers to about one hundred and fifty (150) micrometers.

18. The process as recited in claim 14, wherein the one or more electrical interconnections comprise a redistribution structure.

19. The process as recited in claim 14, wherein positioning one or more semiconductor package devices further comprises positioning one or more semiconductor package devices over the first surface so that a micro-solder bump disposed over the semiconductor package devices is in contact with an electrical interconnection of the one or more electrical interconnections.

* * * * *